United States Patent [19]

Kojima

[11] 4,256,984

[45] Mar. 17, 1981

[54] INTERLEVEL INTERFACE FOR SERIES POWERED IIL OR SITL

[75] Inventor: Masayuki Kojima, Tokyo, Japan

[73] Assignee: Kabushiki Kaisha Daini Seikosha, Tokyo, Japan

[21] Appl. No.: 913,670

[22] Filed: Jun. 8, 1978

[30] Foreign Application Priority Data

Jun. 15, 1977 [JP] Japan .................................. 52-70872
Jun. 15, 1977 [JP] Japan .................................. 52-70873

[51] Int. Cl.³ ................. H03K 19/091; H03K 19/092
[52] U.S. Cl. ......................... 307/296 R; 307/DIG. 1; 307/475; 357/22; 357/43; 357/48; 357/92
[58] Field of Search .............. 307/296 R, 213, 299 B, 307/DIG. 1; 357/92, 44, 46

Primary Examiner—William D. Larkins

Attorney, Agent, or Firm—Robert E. Burns; Emmanuel J. Lobato; Bruce L. Adams

[57] ABSTRACT

In a Static Induction Transistor Logic (or an Integrated Injection Logic) semiconductor device having a lateral PNP transistor used as an injector and a longitudinal field effect transistor (or a longitudinal NPN transistor) used as a driving transistor, a collector of a transistor for a level-converter which converts a signal level from an upper layer or first logic level to a lower layer or second logic level is connected to a gate (or a base) of a driving transistor placed in the lower layer through a current limiting element integrated on the same chip to effectively use an injection current in a signal-level converting circuit used in a Static Induction Transistor Logic or in an Integrated Injection Logic which is constructed by using a laminated circuit construction.

2 Claims, 10 Drawing Figures

INTERLEVEL INTERFACE FOR SERIES POWERED IIL OR SITL

BACKGROUND OF THE INVENTION

The present invention relates to a Static Induction Transistor Logic (hereinafter referred to as SITL) device and an Integrated Injection Logic (hereinafter referred to as IIL) device which are constructed with a lamination circuit construction respectively and can be operated with less power consumption than prior art devices.

Among the many semiconductor devices, a SITL semiconductor device and a IIL semiconductor device are the semiconductor devices which can be operated at high frequency and with less power consumption, that is, in which the delay-power products thereof are small and the packing densities thereof are high.

The SITL semiconductor device consists of a lateral PNP transistor which acts as an injector and a longitudinal field effect transistor which acts as a driving transistor. On the other hand the IIL semiconductor device consists of a lateral PNP transistor which acts as an injector and a longitudinal NPN transistor which acts as a driving transistor.

In the SITL semiconductor device and IIL semiconductor device a lamination circuit construction is sometimes used in order to make it to operate with a small logical-amplitude-level (such as 0.7 volts) and to effectively use an injection current. For example, when a double-layer construction is used, it is required to exchange the signal between the upper layer and the lower layer by using a signal-level converting circuit. When the signal is converted from the upper layer to the lower layer, in the prior art, the collector of the transistor for converting the signal level is directly connected to the gate of the longitudinal field effect driving transistor or to the base of the longitudinal NPN driving transistor formed in the respective lower layers, so large injection currents flow.

SUMMARY OF THE INVENTION

The object of the present invention is to provide the circuit wherein the collector of a signal level converting transistor is connected to the gate of the longitudinal field effect driving transistor or to the base of the longitudinal NPN driving tansistor via a resistor and/or a diode in order to limit the current from the signal level converting transistor.

DETAILED DESCRIPTION OF THE PREFERRED EMBODIMENTS

In the following, the present invention will be described in detail in conjunction with the drawings.

Figure 1A:
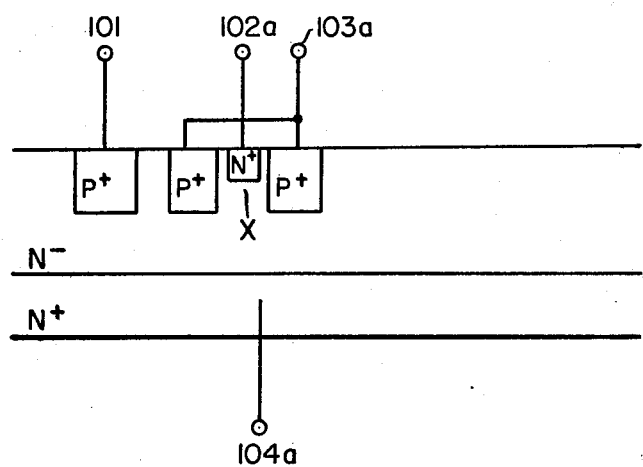
FIGS. 1(a) and 1(b) are diagrammatical sectional views of a basic constructions of a SITL semiconductor device and a IIL semiconductor device respectively.
Figure 1B:
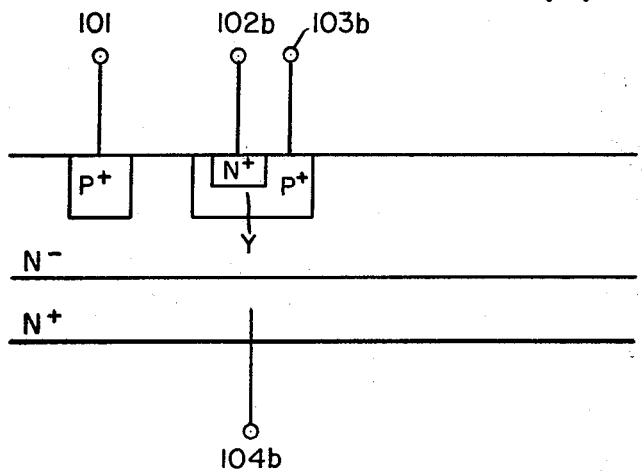

FIGS. 1(a) and 1(b) show diagrammatical sectional views of a basic construction of the SITL semiconductor device and the IIL semiconductor device respectively. In FIGS. 1(a) and 1(b) 101 is an emitter of an injector, 102a and 102b are a drain of a longitudinal field effect driving transistor X and the collector of a longitudinal NPN driving transistor Y respectively, 103a and 103b and a gate of the driving transistor X and the base of the driving transistor Y respectively, 104a represents a base of the injector and a source of the driving transistor X and 104b represents a base of the injector and a emitter of the driving transistor Y.

Figure 2A:
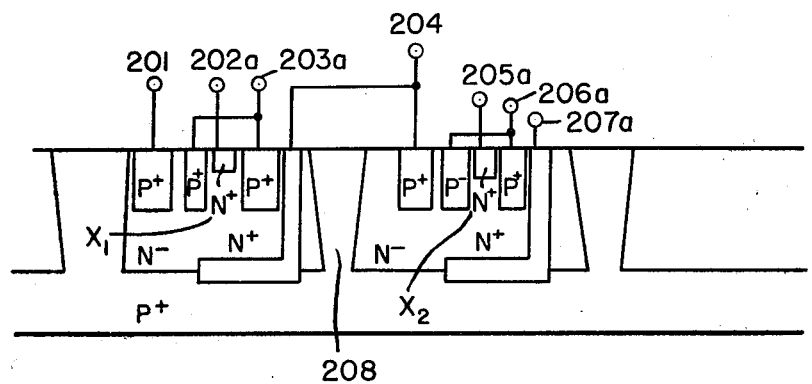
FIGS. 2(a) and 2(b) are basic diagrammatical sectional views of the SITL semiconductor device and the IIL semiconductor device respectively wherein respective lamination circuit constructions are used.
Figure 2B:
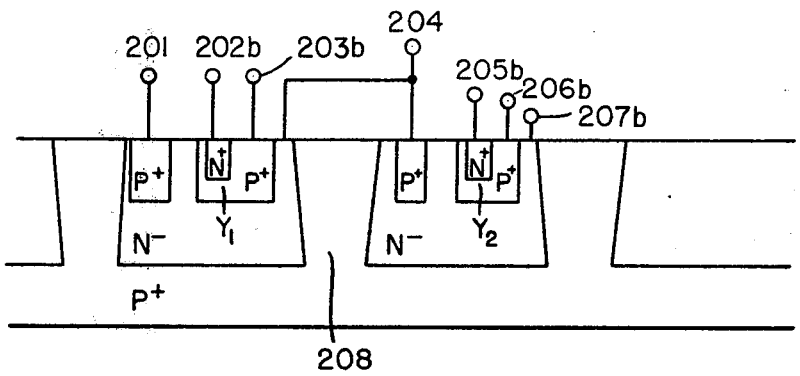

FIGS. 2(a) and 2(b) show basic diagrammatical sectional views in the respective lamination circuit constructions of the SITL semiconductor device and the IIL semiconductor device. In FIGS. 2(a) and 2(b) 201 is the emitter of an injector, 202a and 202b are a drain of a driving transistor X1 and the collector of a driving transistor Y1 respectively 203a and 203b are a gate of the driving transistor X1 and the base of the driving transistor Y1 respectively, 204 is an emitter of the injector, 205a and 205b are a drain of a driving transistor X2 and the collector of a driving transistor Y2 respectively, 206a and 206b are a gate of the driving transistor X2 and the base of the driving transistor Y2 respectively, 207a represents the base of the injector and the source of the driving transistor X2, 207b represents the base of the injector and the emitter of the driving transistor Y2 and 208 is an isolation layer.

Figure 3A:
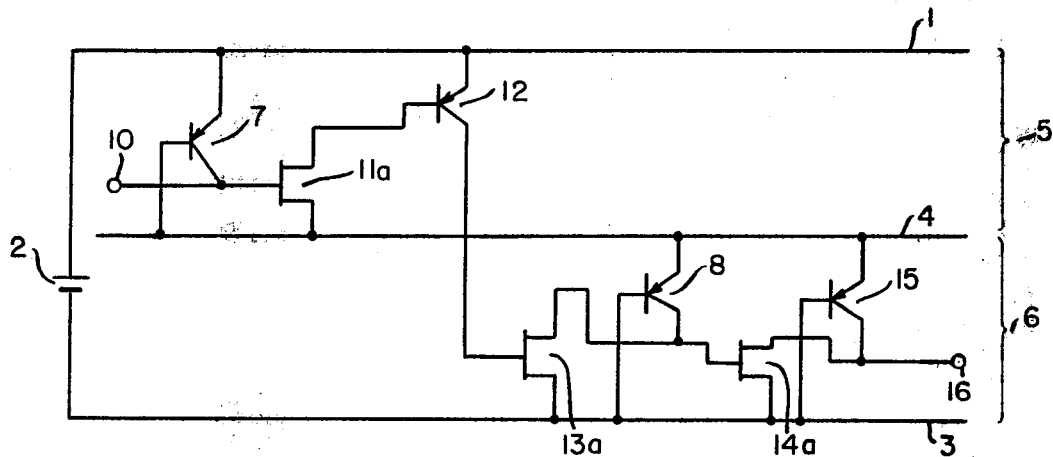
FIGS. 3(a) and 3(b) are circuit diagrams of the conventional signal-level converting circuit of a SITL semiconductor device and a IIL semiconductor device respectively.
Figure 3B:
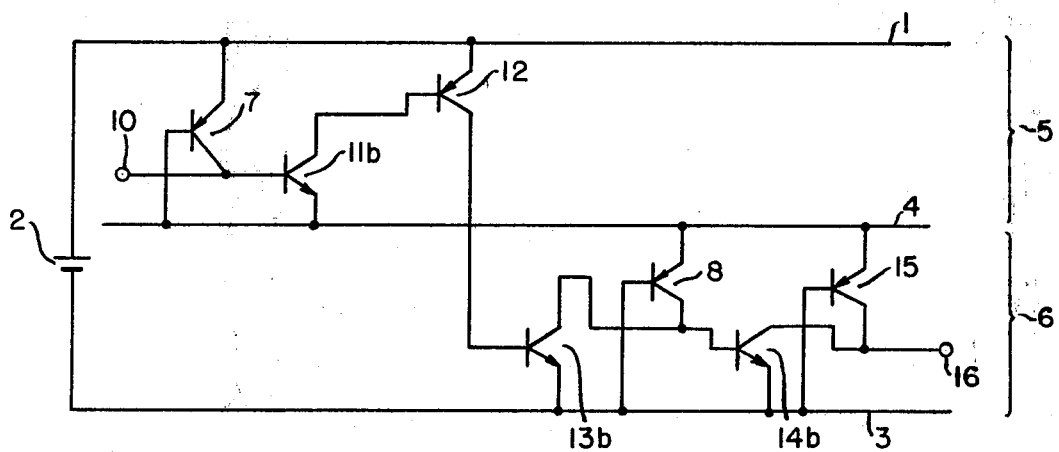
Figure 4A:
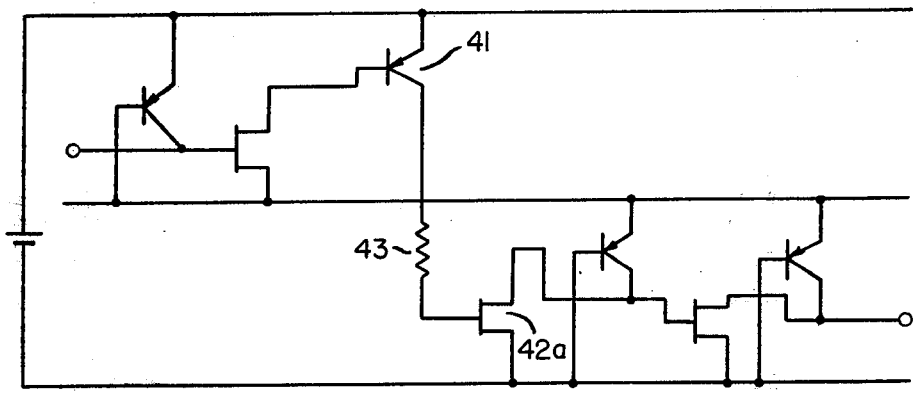
FIGS. 4(a) and 4(b) are the embodiments of a SITL semiconductor device and a IIL semiconductor device according to the present invention respectively.
Figure 4B:
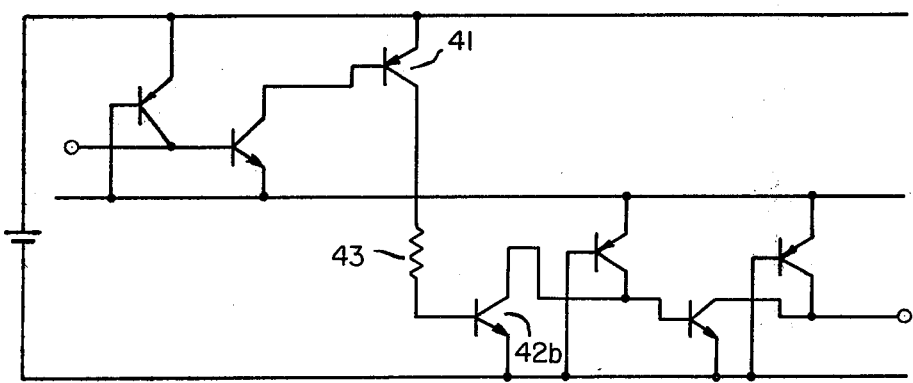
Figure 5A:
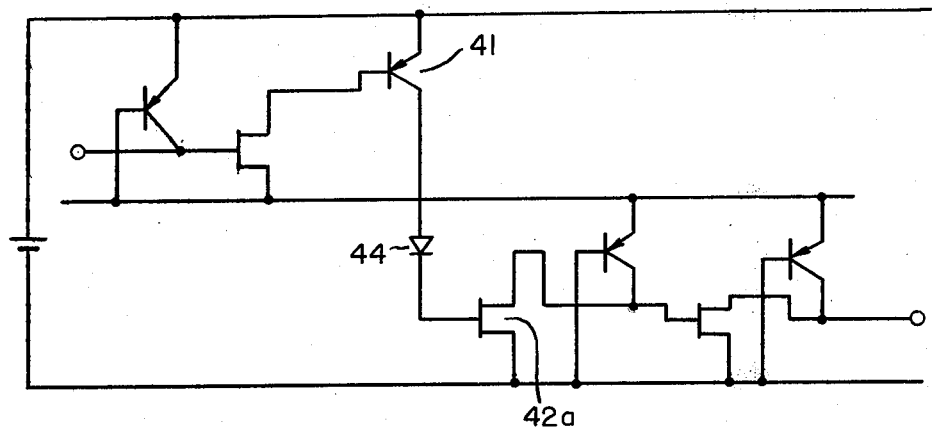
FIGS. 5(a) and 5(b) are the other embodiments of a SITL semiconductor device and a IIL semiconductor device according to the present invention respectively.
Figure 5B:
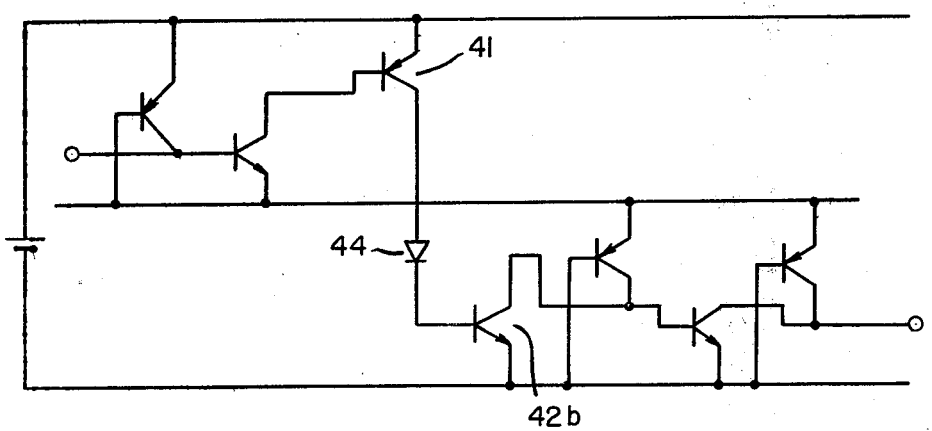

FIGS. 3(a) and 3(b) show circuit diagrams for a conventional signal-level converting circuit of the SITL semiconductor device and the IIL semiconductor device respectively. FIGS. 4(a) and 4(b) show circuit diagrams of the embodiments of the SITL semiconductor device and the IIL semiconductor device according to the present invention respectively, and FIGS. 5(a) and 5(b) show circuit diagrams of the other embodiments of the SITL semiconductor device and the IIL semiconductor device respectively.

In FIGS. 3(a) and 3(b), the SITL and the IIL in the case of the double-layer construction are shown respectively. A power source line 1 is connected to a positive terminal of a battery 2 (e.g. a battery of 1.5 volts) and a power source line 3 is connected to a negative terminal of the battery 2. An upper-layer circuit 5 is separated from a lower-layer circuit 6 by a power source line 4. The base current of a transistor 7 which acts as the injector in the upper-layer circuit 5 is supplied to a transistor 8 which acts as the injector in the lower-layer circuit 6 via the power source line 4 so that the injection current from the battery is effectively used.

Now, the signal-level converting operation in the circuits shown in FIGS. 3(a) and 3(b) will be described. To simplify the description, it is assumed that the voltage of the battery is 1.4 volts and the voltage of power source line 4 is equal to 0.7 volts, the base-emitter voltage of a transistor 8. That is, it is assumed that the upper-level circuit 5 is operated with the logical amplitude from 0.7 to 1.4 volts and the lower-layer circuit 6 is operated with the logical amplitude from 0 to 0.7 volts.

When the voltage at input terminals 10 are 1.4 volts, transistors 11a and 11b are turnedon respectively and level-converting transistors 12 are turned on respectively. Therefore, transistors 13a and 13b in the respective lower-layers are also turned on. At this time, since the collector currents of the injector transistor 8 in the respective lower-layers are sunk to the transistors 13a and 13b respectively, output transistors 14a and 14b will be turned off respectively. Consequently, output terminals 16 become 0.7 volts by the effect of 0.7 volts of a constant current loads 15. On the contrary, when the voltage of the input terminals 10 are 0.7 volts, the transistors 11a and 11b are turned off respectively and the level-converting transistors 12 are turned off respectively. Therefore, the transistors 13a and 13b will be turned off respectively. As a result, the collector currents of the injector transistors 8 in the respective lower-layers are injected to the gate of the output transistor 14a and to the base of output transistor 14b and the output transistors 14a and 14b are turned on respectively. Then, the voltages of the output terminals 16 become 0 volt. As described above, since the respective outputs become 0.7 volts when the respective inputs are 1.4 volts, and the respective output become 0 volts when the respective input are 0.7 volts, it is understood that the respective signal levels are converted.

Although the respective level-converting transistors 12 are turned on when the voltages of the respective input signals are 1.4 volts, at this time the voltages of 1.4 volts are applied to the gate of the transistor 13a and to the base of the transistor 13b in the respective lower layers (only when it is assumed that the collector-emitter saturation voltage $V_{CE}$ (sat) of the level-converting transistors 12 are sufficiently small comparing with 1.4 volts respectively.) Therefore, since large currents flow through the circuit paths defined by the emitters of the level-converting transistors 12, the collectors of the transistors 12, the gate of the transistor 13a and the base of the transistor 13b, the source of the transistor 13a and the emitter of the transistor 13b respectively, these prevent the power consumption from decreasing in the respective lamination circuit constructions used for the purpose of effective use of injection current.

In the devices according to the present invention shown in FIGS. 4(a) and 4(b), to eliminate the above-described drawbacks, a resistor 43 is inserted between the collector of a level-converting transistor 41 and the gate of a transistor 42 in the lower layer as shown in FIG. 4(a), a resistor 43 is inserted between the collector of a level-converting transistor 41 and the base of transistor 42b in FIG. 4(b) and diodes 44 are inserted in like manner as shown in FIGS. 5(a) and 5(b) respectively. As the level-converting operation described about with reference to FIGS. 3(a) and 3(b) is the same as that in the circuits illustrated in FIGS. 4(a) 4(b), 5(a) and 5(b), the description of the operation of the circuits illustrated in FIGS. 4(a) 4(b), 5(a) and 5(b) will be omitted.

The resistance value of the resistor 43 is selected in such a way that the collector current of the level-converting transistor 41 is not less than the necessary minimum gate current of the transistor 42a or the necessary minimum base current of the transistor 42b. Since the diode 44 can be formulated on the chip in smaller area than the area required for the resistor 43, it is suitable for an integrated circuit.

As described above, inserting one or more resistors makes it possible to reduce a current from the level converting transistor without interfering with the level-converting operation. The present invention provides a level-converting-circuit semiconductor device which is very effective and particularly when operation over a long time is required with a limited battery capacity, for instance, in the case that SITL or IIL is used as a logical semiconductor circuit for a wrist watch.

What is claimed is:

1. In a series powered logic circuit including a first plurality of bipolar transistors and second plurality of bipolar transistors, each bipolar transistor of said second plurality of bipolar transistors having emitter and collector regions of a first conductivity type separated by a base region of a second conductivity type, each bipolar transistor of said first plurality of bipolar transistors having emitter and collector regions of the second conductivity type separated by a base region of the first conductivity type, said logic circuit including at least first and second logic circuit levels, each level comprising first and second power supply connections, at least one logic gate including one transistor of said first plurality of transistors and one transistor of said second plurality of transistors, said one transistor of said first plurality of transistors having its emitter connected to said first power supply connection, having its base connected to said second power supply connection, and having its collector connected to an input node of said logic gate, said one transistor of said second plurality of transistors having its base connected to said input node, its emitter connected to said second power supply connection, and having its collector serving as an output node of said logic gate, said first and second logic circuit levels being connected in series via their first and second power supply connections across first and second power supply points, with the first power supply connection of said first logic circuit level being connected to said first power supply point, and with the second power supply connection of said second logic circuit level being connected to said second power supply point, the first power supply connection of said second logic level being coupled to the second power supply connection of said first logic level, a second transistor of said first plurality of bipolar transistors having its emitter connected to the first power supply connection of said first logic level, its base connected to the output node of said logic gate of said first level, the collector of said second transistor of said first plurality of bipolar transistors being coupled to the base of a second transistor of said second plurality of transistors, the emitter of said second transistor of said second plurality of transistors being connected to the second power supply connection of said second logic level, the collector of said second transistor of said second plurality of transistors connected to the input node of said logic gate of said second logic circuit level, the improvement comprising: a current limiting element, wherein the collector of said second transistor of said first plurality of bipolar transistors is coupled to the base of said second transistor of said second plurality of transistors via said current limiting element for limiting the current supplied to said second transistor of said second plurality of transistors from said second transistor of said first plurality of bipolar transistors.

2. In a series powered logic circuit including a first plurality of bipolar transistors and second plurality of junction field effect transistors, each junction field effect transistors of said second plurality of junction field effect transistors having source and drain regions of a first conductivity type joined by a channel region of the first conductivity type, a gate region of opposite conductivity type forming a PN junction with said channel region, said channel region being non-conductive between said source and drain in the absence of a voltage applied between said source and gate of a polarity effective to forward bias the junction between said gate and said channel, said logic circuit including at least first and second logic circuit levels, each level comprising first and second power supply connections, at least one logic gate including one transistor of said first plurality of transistors and one transistor of said second plurality of transistors, said one transistor of said first plurality of transistors having its emitter connected to said first power supply connection, having its base connected to said second power supply connection, and having its collector connected to an input node of said logic gate, said one transistor of said second plurality of transistors having its gate connected to said input node, its source connected to said second power supply connection, and having its drain serving as an output node of said logic gate, said first and second logic circuit levels being connected in series via their first and second power supply connections across first and second power supply points, with the first power supply connection of said first logic circuit level being connected to said first power supply point, and with the second power supply connection of said second logic circuit level being connected to said second power supply point, the first power supply connection of said second logic level being coupled to the second power supply connection of said first logic level, a second transistor of said first plurality of bipolar transistors having its emitter connected to the first power supply connection of said first logic level, its base connected to the output node of said logic gate of said first level, the collector of said second transistor of said first plurality of bipolar transistors being coupled to the gate of a second transistor of said second plurality of transistors, the source of said second transistor of said second plurality of transistors being connected to the second power supply connection of said second logic level, the drain of said second transistor of said second plurality of transistors connected to the input node of said logic gate of said second logic circuit level, the improvement comprising: a current limiting element, wherein the collector of said second transistor of said first plurality of bipolar transistors is coupled to the gate of said second transistor of said second plurality of transistors via said current limiting element for limiting the current supplied to said second transistor of said second plurality of transistors from said second transistor of said first plurality of bipolar transistors.

* * * * *